United States Patent [19]

Breedis et al.

[11] Patent Number: 4,498,121
[45] Date of Patent: Feb. 5, 1985

[54] COPPER ALLOYS FOR SUPPRESSING GROWTH OF CU-AL INTERMETALLIC COMPOUNDS

[75] Inventors: John F. Breedis, Trumbull; Julius C. Fister, Hamden, both of Conn.

[73] Assignee: Olin Corporation, New Haven, Conn.

[21] Appl. No.: 457,605

[22] Filed: Jan. 13, 1983

[51] Int. Cl.³ .................. H01R 4/62; H01R 9/09; H01B 1/02
[52] U.S. Cl. .................. 361/401; 428/652; 29/589
[58] Field of Search .................. 361/411, 421; 357/69, 357/70, 71; 428/652, 618; 174/126 CP, 94 R; 219/118, 148; 420/485; 228/263.17, 263.18, 179; 403/271

[56] References Cited

U.S. PATENT DOCUMENTS

| 3,217,401 | 11/1965 | White | 29/472.9 |
|---|---|---|---|
| 3,568,301 | 3/1971 | Shibata | 29/471.3 |
| 3,689,684 | 9/1972 | Cox, Jr. et al. | 174/68.5 |
| 3,781,596 | 12/1973 | Galli et al. | 361/398 |
| 3,832,769 | 9/1974 | Olyphant, Jr. et al. | 29/626 |
| 4,096,983 | 6/1978 | Bellein et al. | 228/179 X |
| 4,337,089 | 6/1982 | Arita et al. | 420/472 |
| 4,441,118 | 3/1984 | Fister et al. | 357/70 |

FOREIGN PATENT DOCUMENTS

| 2311400 | 12/1974 | Fed. Rep. of Germany | 420/485 |
|---|---|---|---|
| 442268 | 8/1912 | France | 420/485 |
| 21207 | 12/1966 | Japan | 420/485 |
| 700650 | 12/1953 | United Kingdom | 420/485 |

OTHER PUBLICATIONS

"Striped CA 724 (9% Nickel) Puts Gold in its Place and Saves Money Doing It," *Nickel Topics*, p. 8.

Primary Examiner—J. V. Truhe
Assistant Examiner—Roger B. Carr
Attorney, Agent, or Firm—Barry L. Kelmachter; Howard M. Cohn; Paul Weinstein

[57] ABSTRACT

Copper alloys are disclosed which may be bonded to aluminum containing members with reduced formation of undesirable copper-aluminum intermetallic compounds. The copper alloys consist essentially of about 15% to about 30% nickel and the balance essentially copper. The nickel addition in the alloys suppresses the nucleation rate and the subsequent growth rate of copper-aluminum intermetallic compounds. The copper alloys of the instant invention have particular utility in integrated circuit assemblies as lead frames, lead wires and beam lead tapes.

10 Claims, 3 Drawing Figures

COPPER ALLOYS FOR SUPPRESSING GROWTH OF CU-AL INTERMETALLIC COMPOUNDS

The present invention relates to cupronickel alloys which have particular utility in electrical applications.

Numerous electronic devices utilize packages containing semiconductor integrated circuits on silicon chips. Generally, the circuits are electrically connected to another electrical component such as a lead frame or lead conductor by one or more leadwires. Often, the leadwires are formed from gold because of its electrical conductivity and its bondability. However, because of the expense associated with gold, there has been an impetus towards using alternative materials such as aluminum and its alloys for the leadwires.

In forming the electrical connection between a lead frame and the chip, the leadwires generally are bonded to metallic pads on a surface of the chip. The pads may be formed from gold or aluminum spot deposited onto the chip.

It is known in the art that when a gold member such as a gold leadwire is bonded to an aluminum member such as an aluminum pad, there is a compatibility problem. When subjected to high temperatures, an aluminum-gold combination can result in the formation of certain intermetallic compounds which degrade the strength and reliability of any metallurgical bond between the members. This phenomena is referred to as purple plague.

Many different approaches have been tried to avoid this problem. In one approach, only aluminum leadwires are bonded to aluminum pads or stripes and only gold leadwires are bonded to plated gold pads or gold stripes. In some instances, neither wire type is bonded directly to the lead frame metal or metal alloy.

A more common technique for avoiding the formation of undesirable intermetallics has been to coat at least one of the components to be bonded together with a suitable barrier material such as nickel or nickel-boron. The barrier material prevents the formation of intermetallic compounds as a result of diffusion between the bonded members. U.S. Pat. No. 3,781,596 to Galli et al. illustrates such a nickel barrier layer interposed between an aluminum pad and a gold layer. While such barrier layers are effective in preventing the formation of undesirable intermetallics, the additional expense associated with applying a protective coating to one or more of the members to be bonded together makes this approach undesirable. In addition, there are problems of nonuniformity of the coating and potential entrapment of small amounts of plating solution in a plated coating which can later cause blisters and other defects. Furthermore, when nickel is used as the barrier material, exposure of the nickel to elevated temperatures may cause formation of a nickel oxide film which is exceedingly difficult to remove and which does not solder satisfactorily.

Another approach has been to look for materials other than gold and aluminum to be used for components such as leadwires, lead frames, pads and the like. The materials most commonly mentioned include nickel and its alloys, iron and its alloys, cobalt and its alloys, and copper and its alloys. For example, in U.S. Pat. No. 3,217,401 to White, a nickel or copper leadwire is coated with aluminum and then pressed against a silicon layer of a semiconductor device. In U.S. Pat. No. 4,096,983 to Beilein et al., a process is disclosed for bonding a copper wire lead to a gold film on an alumina ceramic substrate.

It has been suggested to form lead frames or lead conductors and other electrical components from alloys of nickel, iron and/or cobalt such as Kovar, and alloys of copper including phosphor bronze, red brass, beryllium copper, silver copper and cupronickels such as copper alloy C72500 and nickel silver. U.S. Pat. Nos. 3,568,301 to Shibata, 3,689,684 to Cox, Jr. et al., 3,832,769 to Olyphant, Jr. et al. and 4,337,089 to Arita et al. and the article "Striped CA 725 (9% Nickel) Puts Gold In Its Place And Saves Money Doing It", *Nickel Topics,* pg. 8, illustrate various materials that have been used for these electrical components.

Unfortunately, the bonding of copper and copper alloy members to members containing aluminum often result in the formation of copper-aluminum intermetallic compounds. These copper-aluminum intermetallic compounds tend to be brittle and degrade the integrity of the bond between the members. They may also adversely affect the electrical conductivity characteristics of the bonded members. To avoid formation of these undesirable intermetallic compounds, semiconductor manufacturers have added a silver plated stripe in the area where the aluminum member, such as a leadwire, is to be bonded to a copper member such as a lead frame. In lieu of a silver plated stripe, a nickel plated surface has also been used.

It is an object of the invention to provide a copper base alloy member which may be bonded to a member containing aluminum with reduced formation of copper-aluminum intermetallic compounds.

It is a further object of the invention to provide a copper base alloy member as above bonded to an aluminum containing member with a bond characterized by improved strength and integrity.

It is a further object of the invention to provide a copper base alloy member as above which may be bonded to an aluminum containing member to form an article having particular use in electrical applications.

These and further objects will become apparent from the following description and drawings.

In accordance with the instant invention, a copper base alloy that may be bonded to an aluminum containing member with reduced levels of copper-aluminum intermetallic compounds being formed is disclosed. The copper base alloys used in accordance with the present invention have a nickel content of at least about 15%.

While cupronickel alloys having nickel contents of at least about 15% are commercially available, heretofore it was not recognized that when members formed from such alloys are bonded to aluminum containing members, reduced levels of copper-aluminum intermetallic compounds are formed. It has been found that a nickel addition of about 15% or greater suppresses the nucleation rate and subsequent growth rate of undesirable copper-aluminum intermetallic compounds.

It has been discovered that particularly good results may be obtained when the copper member to be bonded to an aluminum member is formed from a copper base alloy containing from about 15% to about 30% nickel. In a preferred embodiment, the copper member is formed from a copper base alloy containing from about 19% to about 26% nickel.

The instant invention has been found to have particular utility in integrated circuit assemblies where a copper member is to be bonded to an aluminum containing member. For example, the copper member may be a lead frame to be bonded to an aluminum leadwire. The nickel containing copper base alloys described herein may be used to form lead frames, leadwires and/or beam lead tapes for semiconductor packages.

The copper member to be bonded to the aluminum member may be formed from either the nickel containing copper alloy alone or a composite material including the nickel containing copper alloy. When being used as part of a composite structure, the nickel containing copper alloy may be used as either the cladding or the core material.

Still further objects, features, advantages and applications of the instant invention will become apparent from the following description and drawings.

In accordance with the present invention, the foregoing objects and advantages are readily attained.

Figure 1:
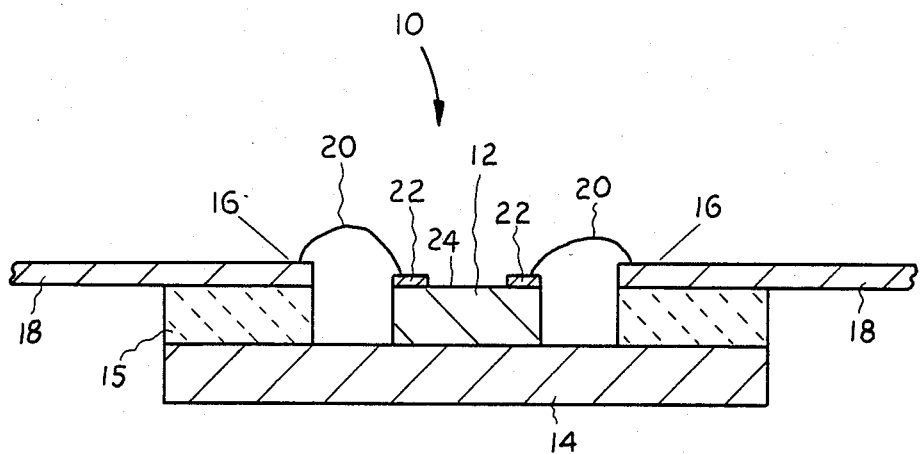
FIG. 1 is a sectional view of an integrated circuit assembly showing a wire conductor interconnecting a pad on the surface of an integrated circuit chip with an end of a lead frame.
Figure 2:
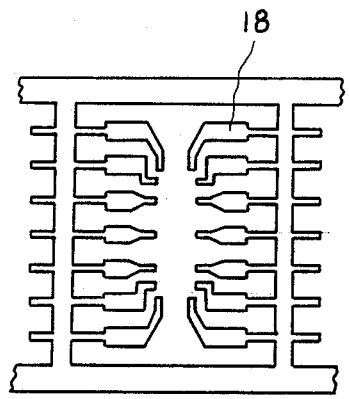
FIG. 2 is a plan view of a lead frame.
Figure 3:
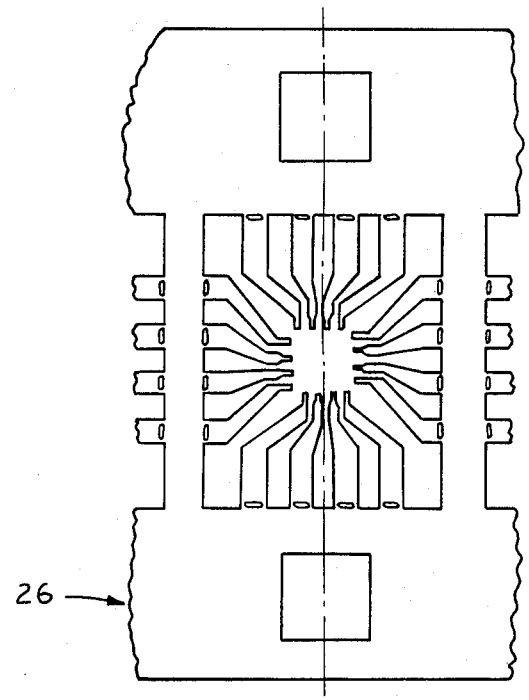
FIG. 3 is a plan view of a beam lead tape.

Referring now to FIG. 1, an integrated circuit assembly 10 is illustrated. The assembly 10 has an integrated circuit chip 12 mounted on a metallic base 14. The chip 12 may be formed from any suitable semiconductive material such as silicon or germanium and may be mounted to the base 14 in any suitable manner such as by using an adhesive. A plurality of leads 16 from a lead frame 18 are also mounted to the base 14. The leads 16 may be mounted to the base by bonding them to a dielectric material 15 which is in turn bonded to the base 14.

A plurality of leadwires 20 are bonded to the chip 12 and to the leads 16 to form an electrical connection therebetween. The leadwires 20 may be bonded to the chip 12 and the leads 16 using any suitable conventional technique such as thermosonic bonding, thermocompression bonding, ultrasonic bonding, etc. Generally, the leadwires 20 are bonded to a plurality of pads 22 on a surface 24 of the chip 12.

Many different materials have been used for the various components of the integrated circuit assembly. For example, the leads 16 and the lead frame 18 have been formed from copper and copper alloys, the leadwires 20 have been aluminum wires, and the pads 22 have been spots of gold plated onto the surface 24. The major problem in forming assemblies with these materials has been the formation of undesirable intermetallic compounds, such as copper-aluminum intermetallic compounds and gold-aluminum intermetallic compounds, that adversely affect such properties as electrical conductivity, solderability, and ductility and the integrity and reliability of the metallurgical bonds between the various components.

It has been surprisingly found that copper base alloys containing at least about 15% nickel when bonded to aluminum containing members form significantly reduced levels of copper-aluminum intermetallic compounds. As a result of this, the aforementioned compatibility problems may be minimized and such expedients as precious metal plating and the use of gold components may be eliminated. For example, the lead frame and/or the leadwires of the integrated circuit assembly may be formed from the nickel containing copper alloys described herein. In addition, gold leadwires and/or gold pads on the chip may be replaced by aluminum leadwires and/or pads.

Copper alloys containing a nickel addition of at least about 15% act as a means for suppressing aluminum-rich intermetallic compound formation. It is believed that the nickel in the alloys suppresses the nucleation rate and the growth rate of these undesirable intermetallic compounds by slowing down the diffusion rate of copper. As a result, bonds characterized by improved strength, electrical conductivity, solderability and mechanical integrity can be formed between copper and aluminum containing members.

The copper alloys in accordance with the instant invention should have a nickel content in the range of about 15% to about 30%. Preferably, the nickel content is in the range of about 19% to about 26%. One or more additional elements may be present in the alloys provided they do not interfere with the role of the nickel addition and do not adversely affect other desirable properties. The elements which may be added include zinc, manganese, iron, tin, chromium and molybdenum. These elements may be present in the following levels: up to about 25% zinc; up to about 6% manganese; up to about 1% iron; up to about 1% tin; up to about 3% chromium; and up to about 2% molybdenum. In addition, aluminum and/or silicon may be added to the nickel containing alloy to improve oxidation resistance and provide higher strength and resistance to leadbend fatigue. The alloy may contain aluminum up to about 1% and/or silicon up to about 1%. As used herein, the percentages described are weight percentages.

The nickel containing copper alloys described herein may be cast in any convenient manner. The particular method of casting is not especially critical and any suitable method such as direct chill or continuous casting may be employed. After casting, the alloys may be processed in accordance with any suitable processing schedule. The processing used would depend upon the properties to be imparted to the alloy and its intended use. For example, the nickel containing copper alloy may be hot rolled using any suitable starting temperature. Following hot rolling, the alloy may be cold rolled to a desired final gage in one or more steps with or without at least one intermediate anneal. After being processed to final gage, the alloy may be subjected to a suitable heat treatment for providing it with a desired temper. The various processing steps may be performed in any convenient manner known in the art.

After being processed to have the desired properties and/or temper, the nickel containing copper alloy may be fabricated into any desired article. For example, it may be fabricated into a lead frame 18, a leadwire 20, a lead beam tape 26, or any other article. Any suitable fabrication technique known in the art may be used to fabricate the desired article.

If desired, the nickel containing copper alloy may be used as part of a composite structure to which an aluminum member is to be bonded. The composite structure may be either a biclad or a triclad with the nickel containing copper alloy forming either the cladding or the core material. If the composite structure is to be used as either a lead frame or a beam lead tape, then the nickel containing copper alloy preferably is used as the cladding material while the core may be formed from a suitable metal or metal alloy such as copper alloy C15100, copper alloy C63800, copper alloy C63810, copper alloy C11000 and copper alloy C19400. By using the nickel containing copper alloy as the cladding material, a satisfactory surface which may be bonded to an aluminum member is provided.

To demonstrate the instant invention, five composites were prepared. The composites consisted of a strip of aluminum alloy 1100 as a cladding bonded to one of the following core materials: (1) a strip of copper alloy C11000; (2) a strip of a copper alloy consisting essentially of about 10% nickel and the balance essentially copper; (3) a strip of a copper alloy consisting essentially of about 20% nickel and the balance essentially copper; (4) a strip of a copper alloy consisting essentially of about 30% nickel and the balance essentially copper; and (5) a strip of nickel alloy 200. The composites were formed using the POSIT-BOND ® bonding process.

Samples of each composite were annealed at 200° C., 300° C. and 400° C. The annealing times extended up to 32 hours. Thereafter, the samples were examined metallographically for evidence of intermetallic compounds. The maximum intermetallic thickness observed in each material at each of the anneal conditions is summarized in Table I.

TABLE I

| Composite | Temperature (°C.) | Maximum Intermetallic Thickness (microns) Time (Hours) | | | | |
|---|---|---|---|---|---|---|
| | | 2 | 4 | 8 | 16 | 32 |
| Al/C110 | 200 | .39 | .39 | .78 | .78 | .78 |
| Al/Cu + 10Ni | 200 | 0 | .39 | .78 | .39 | .78 |
| Al/Cu + 20Ni | 200 | 0 | 0 | 0 | .39 | .39 |
| Al/Cu + 30Ni | 200 | 0 | 0 | 0 | 0 | 0 |
| Al/Ni | 200 | 0 | 0 | 0 | 0 | 0 |
| | | .5 | 1 | 2 | 4 | 8 | 16 |
| Al/C110 | 300 | 1.6 | 1.6 | 2.3 | 3.1 | 3.1 | 3.9 |
| Al/Cu + 10Ni | 300 | 1.6 | 1.6 | 2.3 | 2.3 | 3.1 | 4.7 |
| Al/Cu + 20Ni | 300 | 0 | .78 | 1.6 | 2.3 | 2.3 | 3.1 |
| Al/Cu + 30Ni | 300 | 0 | 0 | 0 | 0 | 0 | 0 |
| Al/Ni | 300 | 0 | 0 | 0 | 0 | 0 | 0 |
| | | .5 | 1 | 2 | 4 | 8 | 1b |
| Al/C110 | 400 | 6.2 | 7 | 9.3 | 10.9 | 16 | 21.8 |
| Al/Cu + 10Ni | 400 | 5.4 | 7 | 11.7 | 16 | 20.2 | 27.2 |
| Al/Cu + 20Ni | 400 | 3.9 | 5.4 | 7.8 | 10.1 | 14.4 | 16 |
| Al/Cu + 30Ni | 400 | 1.6 | .78 | 2.3 | 2.3 | 5.4 | 6.2 |
| Al/Ni | 400 | .39 | .78 | 1.6 | 2.3 | 2.3 | 4.7 |

The data shows that nickel additions in accordance with the instant invention dramatically suppress the rate of copper-aluminum intermetallic compound formation.

While the nickel containing alloys have been described in the context of components for integrated circuit assemblies, they may be used in other environments where a copper member is to be bonded to an aluminum member and it is desired to minimize the formation of copper-aluminum intermetallic compounds.

While a particular type of integrated circuit assembly has been illustrated in FIG. 1, the copper alloy members of the instant invention may be used in other types of integrated circuit assemblies. For example, the copper alloy member may comprise a post or other electrical component which is electrically connected to a chip by one or more aluminum or aluminum alloy leadwires.

The patents and article set forth in the specification are intended to be incorporated by reference herein.

It is apparent that there has been provided in accordance with this invention copper alloys for suppressing growth of copper-aluminum intermetallic compounds which fully satisfy the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:
1. A *circuit assembly* comprising:
   a *leadwire* formed from an aluminum containing material;
   a *lead frame* formed from a copper containing material;
   said *leadwire and lead frame* being bonded together, wherein the improvement comprises:
   said *lead frame* being formed from a copper base alloy consisting essentially of at least about 15% nickel and the balance essentially copper, said copper base alloy suppressing the growth of copper-aluminum intermetallic compounds.

2. The circuit assembly of claim 1 further comprising:
   said copper base alloy consisting essentially of about 15% to about 30% nickel and the balance essentially copper.

3. The circuit assembly of claim 1 further comprising:
   said copper base alloy consisting essentially of about 19% to about 26% nickel and the balance essentially copper.

4. The *circuit assembly* of claim 1 wherein:
   said *circuit assembly* comprises an integrated circuit assembly.

5. The circuit assembly of claim 1 wherein:
   said second member comprises a composite structure having said copper base alloy as a cladding material and a metal or metal alloy core.

6. The circuit assembly of claim 1 wherein:
   said copper base alloy further includes up to about 1% aluminum.

7. The circuit assembly of claim 1 wherein:
   said copper base alloy further includes up to about 1% silicon.

8. The *circuit assembly* of claim 1 *further comprising:*
   said *circuit assembly being* an integrated circuit assembly having a semiconductor chip; *and*
   said *leadwire* forming a connection between said chip and said *lead frame.*

9. An integrated circuit assembly having a semiconductor chip, said assembly comprising:
   a pad on a surface of said chip, said pad being formed from an aluminum containing material; and
   a leadwire bonded to said pad, said leadwire being formed from a copper containing material, wherein the improvement comprises:
   said leadwire being formed from a copper base alloy consisting essentially of at least about 15% nickel and the balance essentially copper, said copper base alloy suppressing the growth of copper-aluminum intermetallic compounds.

10. A circuit assembly comprising:
    a member formed from an aluminum containing material;

a beam lead tape formed from a copper containing material;
said first member and said beam lead tape being bonded together,
wherein the improvement comprises:
said beam lead tape being formed from a copper base alloy consisting essentially of at least about 15% nickel and the balance essentially copper, said copper base alloy suppressing the growth of copper-aluminum intermetallic compounds.

* * * * *